United States Patent
Muchamedjarow et al.

(10) Patent No.: US 8,605,292 B2
(45) Date of Patent: Dec. 10, 2013

(54) METHOD AND DEVICE FOR CLEANING AN OPTICAL POSITION MEASUREMENT SYSTEM FOR SUBSTRATES IN A COATING INSTALLATION

(75) Inventors: Damir Muchamedjarow, Bannewitz (DE); Hubertus Von Der Waydbrink, Dresden (DE); Michael Hentschel, Dresden (DE); Marco Kenne, Dresden (DE); Reinhardt Bauer, Dresden (DE); Steffen Leßmann, Dresden (DE); Thomas Bock, Dresden (DE); Reinhard Jaeger, Coswig (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 246 days.

(21) Appl. No.: 13/072,909

(22) Filed: Mar. 28, 2011

(65) Prior Publication Data

US 2011/0290181 A1    Dec. 1, 2011

(30) Foreign Application Priority Data

Mar. 29, 2010  (DE) .................. 10 2010 003 413

(51) Int. Cl.
*G01B 11/14*  (2006.01)
*B05B 5/12*  (2006.01)

(52) U.S. Cl.
USPC ....... 356/614; 118/622; 118/627; 204/298.23

(58) Field of Classification Search
USPC .................. 356/614–623; 118/622, 627, 629; 204/298.23
See application file for complete search history.

(56) References Cited

U.S. PATENT DOCUMENTS

| | | | |
|---|---|---|---|
| 2002/0021450 A1* | 2/2002 | Aoki | 356/499 |
| 2007/0068495 A1 | 3/2007 | Karst | |
| 2007/0268808 A1* | 11/2007 | Culver et al. | 369/126 |
| 2011/0044373 A1* | 2/2011 | Lagakos et al. | 374/188 |
| 2012/0016354 A9* | 1/2012 | Epshtein et al. | 606/15 |

FOREIGN PATENT DOCUMENTS

| | | |
|---|---|---|
| DE | 39 21 402 A1 | 1/1991 |
| DE | 10 2008 017 412 A1 | 10/2009 |
| EP | 2169409 A1 * | 3/2010 |
| JP | 60022116 A | 2/1985 |

* cited by examiner

*Primary Examiner* — Hoa Pham
(74) *Attorney, Agent, or Firm* — Heslin Rothenberg Farley & Mesiti P.C.

(57) ABSTRACT

A method and device are provided for cleaning of an optical position measurement system in a coating installation. The optical position measurement system includes a cantilever, and a sensor head having a radiation inlet and/or outlet for the reception and/or emission of an optical signal, at a free end of the cantilever. For tempering of the sensor head, a local thermoregulation is applied using a heater and/or cooling device for heating and/or cooling of the sensor head depending on thermal conductivity of material of at least the sensor head and depending on secondary heat in the coating installation.

16 Claims, 3 Drawing Sheets

METHOD AND DEVICE FOR CLEANING AN OPTICAL POSITION MEASUREMENT SYSTEM FOR SUBSTRATES IN A COATING INSTALLATION

CROSS REFERENCE TO RELATED APPLICATIONS

This application claims priority of German application No. 10 2010 003 413.4 filed on Mar. 29, 2010, the entire disclosure of which is hereby incorporated herein by reference.

BACKGROUND OF THE INVENTION

The invention refers to an optical sensor to receive optical signals in a coating installation with an optical receiver for the reception of an optical signal, and such a coating installation. Also, the invention refers to a method for cleaning an optical sensor which is arranged in a coating installation.

Such optical sensors are used in coating installations, e.g. PVD-systems for the characterization of the condition or the position of the substrate, or the condition of a coating deposited on the substrate. According to the task requirements of the optical sensor, it is used in various steps along the process of a coating installation, and is exposed to various conditions of the surrounding environment. For instance for the characterization of the coating using an In-situ-measurement method, optical sensors are used within the coating chamber. The determination of the positions of the substrates using optical sensors, e.g. in a continuous method, serves mainly the accurate control of the course of the method in a coating installation. Both the characterization of the coating and the substrate, and the determination of the position of the substrate can take place in the coating chamber as well as in one of the process units of the coating installation arranged prior or subsequently, e.g. transfer chamber, buffer chamber, lock or other units for pre- and post-treatment of the substrate.

Within a coating chamber, mainly the coating parameters influence the functionality of an optical sensor directly. In particular through high temperatures or through coating material depositing on the sensor, the functionality of the optical sensor can be compromised. However in other units involved in the method of a coating installation, influences from adjacent units or from the substrate such as residual gas or coating materials, dust, high temperatures of the substrate or the chamber walls, temperature change or similar can also cause failures, malfunctions or at least distortion of measurement results of the optical sensor. Such effects shorten the intervals the optical sensors in coating installations is to be maintained considerably, and require more time and energy for maintenance or replacement within the vacuum area.

It is known to carry out the cleaning of an optical sensor using a gas flow the sensor is subjected to and completely surrounded by. Depending on the surrounding or the method conditions, the adaption can be done through, e.g. the configuration, dimensioning, location and alignment of the nozzle, through the choice of the gas, or through the pressure and temperature conditions of the gas which flows onto the optical receiver. Using a gas flow, accumulations on the substrate such as of dust or vapor-or particle-like coating material during the operating of a coating installation can be prevented by removing such dirt through a gas flow directed to the receiver before it deposits itself on it. Simultaneously, the temperature of the optical sensor can be specifically influenced by purposefully directing the flow of the gas.

The disadvantage of this kind of cleaning of the optical sensor is that an additional gas supply is needed, and further, an introduction of gas flows into the process atmosphere of the coating installation takes place which again leads to interferences with the stoichiometrical ratio during the gas phase of the coating installation and of the coating deposited on the substrate. For this reason, a stoichiometrically even deposition of a coating on the substrate can be interfered with. Another disadvantage derives from an introduction of the cooler gas flow into the process atmosphere through which the process temperature is interfered with, and for this reason, a temperature gradient is formed partly in the process atmosphere or on the substrate.

Also, optical fibers are generally suitable for the use in position measurement systems. The disadvantage here is also the contamination or rather the condensation through vapors at the end of the optical fibers which depending on the temperature of the process atmosphere quickly becomes unusable. Therefore, the actual functionality of the position measurement system is not ensured anymore.

SUMMARY OF THE INVENTION

According to the invention, a method for cleaning an optical position measurement system arranged in a coating installation is proposed which has a cantilever, and a radiation inlet and/or outlet arranged at its end in a sensor head for receiving and/or emitting an optical signal, wherein a local thermoregulations for tempering the sensor head takes place dependent on the thermal conductivity of the materials at least of the sensor head, and dependent on the secondary heat in the coating installation.

The term radiation inlet and/or outlet is understood in regards to the invention as both a simple radiation inlet for receiving an optical signal, and a radiation outlet for emitting an optical signal. A radiation inlet and outlet which comprise a radiation inlet for receiving an optical signal together with a radiation outlet for emitting an optical signal is preferred.

In one embodiment of the invention, the local thermoregulation takes place at the sensor head. At the same time, the radiation inlet and/or outlet in the sensor head are tempered through the thermoregulation of the sensor head which is why the radiation inlet and/or outlet in the sensor head remains free from depositions of the coating materials.

In another embodiment of the invention, the local thermoregulation takes place spatially separated from the sensor head. At the same time, the sensor head is tempered using the at the cantilever arranged heating and/or cooling element, wherein the cantilever has to have a suitable thermal conductivity.

In another embodiment of the invention, the local thermoregulation takes place using a heating element.

In another embodiment of the invention, the tempering of the sensor head takes place using a heating element, wherein the regulation of the heat output of the heating element takes place through a temperature sensor, wherein the temperature sensor is connected to the heating element via a control circuit.

In another embodiment of the invention, the tempering of the sensor head to a temperature at least above the condensation temperature of the coating materials takes place. Thus, a deposition of coating materials on the sensor head is prevented according to the invention. The temperature sensor in its most simple embodiment is realized as a thermo-element which causes a tempering of the sensor head via a control circuit by controlling the heating element according to amount. At the same time, a temperature above the condensation temperature of the coating materials is determined as the set temperature for the sensor head which at least during the coating procedure must not fall below that. Accordingly if required, for instance if the temperature at the sensor head falls, the heating element is controlled to cause the sensor head to heat up. Whether the heating takes place directly or indirectly is not of importance at this point. Here, the control circuit comprises the temperature sensor as the measuring member which determines the actual value of the temperature, the value of the set temperature as a reference variable, the difference between the actual value and the value of the set temperature as control difference, and the heating element as an actuator.

Also, by tempering is meant in regards to the invention, both the heating and cooling of the sensor head to a predetermined temperature, a set temperature.

In another embodiment of the invention, the sensor head is cooled via a cooling device which is thermally conductively connected with the sensor head. Preferably, the cooling of the sensor head is realized through the thermal conductivity of the cantilever. At the same time, the cantilever is thermally conductively connected with a heat sink within the vacuum chamber.

In another embodiment of the invention, the cooling device is arranged outside the coating installation. The cooling takes place therefore indirectly via the cantilever, which for this purpose has to consist of a material that has to have a suitable thermal conductivity. In this way, an efficient thermal conduction of the material is ensured. The separation of the cantilever of the optical position measurement system from the outside of the coating installation arranged cooling device takes place through a flange which enables at least a vapor tight connection. Through the arrangement of the cooling device outside of the coating installation, there is an advantage the coolant can easily be supplied, whereby a fast heat exchange can take place.

In another embodiment of the invention, the optical position measurement system is used in atmospheric conditions. By atmospheric condition is meant pressure in the range of $300<x<1300$ mbar. In addition, the optical position measurement system according to the invention can be used with higher pressures and is not limited to the range of the high or fine vacuum.

In another embodiment of the invention, the optical position measurement has a cantilever to determine the position of substrates in a coating installation at which free end there is a sensor head, wherein a radiation inlet and/or outlet for the reception or emission of an optical signal is arranged at the sensor head, and wherein the sensor head can be tempered using a heating element and/or cooling element dependent on the thermal conductivity of the material of at least the sensor head. The tempering of the sensor head of the optical position measurement system takes place using a heating and/or cooling element, so that the temperature around the sensor head is at least above the condensation temperature of the coating material. In this way, a deposition of the evaporated coating material on the sensor head is prevented, as consequently, the sensor head remains free from any depositions of the coating material, and can further be used for the position measurement of substrates within the coating installation. The optical position measurement system serves the determination of the position of substrates in a coating installation, in particular in a continuous coating installation.

The cooling of the sensor head can be advantageous to the tempering to adapt to a fast regulation of the temperature at the sensor head to a predetermined set temperature. A fast adaption is particularly advantageous to avoid a heat input in the substrate and the coating through overheating of the sensor head, whereby faults in the layer structure are avoided.

In another embodiment, a cooling element is arranged within the area of the sensor head only, wherein this cooling element is thermally conductively connected with a cooling device. This is in particular of advantage if the material of the sensor head has a low thermal conductivity, whereby a spatially separated cooling is not possible.

In another embodiment, both the heating element and the cooling element are arranged thereby within the area of the sensor head. An advantage of such an arrangement is based on that in this case the sensor head is tempered by heating and cooling, so that the material of the cantilever does not have to be thermally conductive. Another advantage is the significantly smaller heating/cooling supply line that is required to prevent the deposition of coating material at the sensor head.

In another embodiment of the invention, as well the heating element as the cooling element are arranged around the sensor head, wherein heating and cooling element are realized as heating and/or cooling element which can be heated or cooled.

In another embodiment of the invention, a cooling device is provided for the cooling of the optical position measurement system. At the same time, the cooling of the optical position measurement system advantageously takes place through the cantilever of the optical position measurement system, wherein this has to have a suitable thermal conductivity. The cantilever operates here as a heat sink.

In another embodiment of the invention, the cooling device for cooling the optical position measurement system is arranged outside of the coating installation. The separation of the cantilever of the optical position measurement system from the outside of the coating installation arranged cooling device takes place via a flange which at least allows a vapor tight connection.

In another realization of the prior embodiment, the cooling device is arranged outside the coating installation and is thermally conductively connected with the cooling device at the sensor head.

In another embodiment of the invention, the sensor head is realized in a way, so that it can be heated directly using the heating element by having the heating element arranged at the sensor head. For this purpose, the heating element can be arranged as a heating coil, induction heating etc. Through the direct heating of the sensor head through the heating element, a fast change of temperature at the sensor head is possible, which is particular of advantage for quickly changing process conditions as respectively an adjustment to various ambient conditions can take place. At the same time, the heating of the sensor in the sensor head using the heating element takes place.

In another embodiment of the invention, the sensor head is realized in a way, so that it can be heated indirectly using the heating element, by having the heating element arranged at the cantilever and thermally conductively connected with the sensor head. In this way, it is possible to keep the entire section of the cantilever in the procedure chamber at a temperature above the condensation temperature of the coating material. A condensation at the cantilever in the procedure chamber is thus completely prevented which for instance, prevents a falling of condensates on the passing substrate. The heating of the sensor head to a temperature above the condensation temperature of the coating material is ensured through the thermal conductivity of the cantilever in this way. At the same time, by thermal conductivity, also a coefficient of thermal conductivity ($\lambda$) of a solid object, a liquid or gas is meant its ability to transport thermal energy in the form of heat using heat supply lines. The (specific) thermal conductivity is given in W/(k*m), and is a temperature dependent material constant. This must be suitably sufficient to enable an indirect heating.

By an indirect heating in regards to the invention, a heating is understood, which takes place at the optical position measurement system using the heating element, but which takes place spatially separated from the sensor head, which leads consequently to the heating of the sensor head.

In another embodiment of the invention, the optical position measurement system further comprises a temperature sensor, wherein the temperature sensor is connected with the heating element via a control circuit. The temperature sensor in its simplest embodiment can be realized as a thermoelement, which causes a tempering of the sensor head through the control of the heating element if required. At the same time, a temperature is determined at least above the condensation temperature of the coating material as the set temperature for the sensor head, which at least during the coating process must not fall below that. Accordingly if need be, for instance with fall of the temperature at the sensor head, the heating element is controlled to cause the heating of the sensor head. Whether the heating takes place directly or indirectly is in this instance not of any importance. After reaching the set value, the heating element is switched off, whereby a further heating of the sensor head is stopped. The control circuit therefore consists of the temperature sensor as a measuring member, which determines the actual value of the temperature, the set value of the temperature as the reference variable, the difference between the actual value and the set value of the temperature as the control difference, and the heating element as the actuator.

In another embodiment of the invention, the temperature sensor is arranged at the sensor head. A compensation of the temperature of the sensor head takes place directly here through the set temperature, which lies at least above the condensation temperature of the coating material. If the temperature falls below the set temperature, a heating of the sensor head through the heating element takes place, wherein for this purpose, both a direct and indirect heating are possible. The temperature at the sensor head acts here as a disturbance variable of the control circuit consisting of the temperature sensor and heating element. The advantage of the arrangement of the temperature sensor directly at the sensor head is that thus, a more precise compensation of the temperature difference between the actual and set value takes place locally, which according to the invention are to be kept free of depositions of the coating material. Another advantage is a faster regulation of the heat output of the heating element if needed, when falling below the set temperature through a direct compensation of the temperatures (actual and set value) at the sensor head.

In the event, that several coating procedures take place in separate areas of the coating installation, the condensation temperature of the coating material is essential to the area, which is vaporized in the area, in which the optical position measurement system arranged. By separate areas within the coating installation according to the invention is understood at least a vapor tight separation of the individual coating positions of the coating installation, wherein different coating materials are deposited on the substrate in these areas.

In another embodiment of the invention, several optical position measurement systems are provided in the different separate areas of the coating installation, which are adjusted to the in the respective areas of the coating installation prevailing procedure temperature using the heating element.

In another embodiment of the invention, the radiation inlet and/or outlet is realized as a light transmitting element, wherein the light transmitting element consists of a transparent material, which is suitable to transmit light linearly and with low-loss from the inlet to an outlet for at least one chosen range of wavelength. It is to be distinguished from an optical fiber, which because of the total reflection within the fiber does not rely on the linear transmission. The in the described embodiment used light transmitting element can, for instance, be realized as a silica based glass cantilever. This is particularly of advantage when using the optical position measurement system according to the invention in a high temperature range because silica glass has a low thermal conductivity, whereby a damaging heat input to the optical position measurement system through tempering the sensor head can be avoided.

In another embodiment of the invention, the optical position measurement system comprises a temperature sensor, which is arranged at the sensor head, and a cooling device which is thermally conductively connected with the sensor head. Thereby, a compensation of the temperature of the sensor head takes place directly using the set temperature, which is at least equal to or above the vaporization temperature of the coating material. If the temperature should fall below the set temperature, a heating of the sensor head via the heating element takes place, wherein for this purpose both a direct and indirect heating is possible. In the event of a sharp temperature rise, a tempering of the sensor head using the cooling device can take place to avoid a large heat input to the sensor head. The temperature at the sensor head here acts as a disturbance variable of the control circuit consisting of a thermal element, heating element and cooling device. Another advantage is the fast regulation of the tempering of the sensor head through heating using the heating element as well as through cooling using the cooling device, whereby an exact adjustment of the set value of the sensor head is possible. There is an advantage that the temperature of the sensor head is constant and fluctuations in temperature within area of the sensor head are avoided, which spatially is arranged near the substrate to be able to perform an optical position measurement of the substrate. If the sensor head is heated too strongly, a heat input to the substrate may possibly take place through heat radiation from the sensor head, which can lead to an interruption when depositing the coating material on the substrate. A cooling of the sensor head via the cantilever is particularly of advantage as in this instance, the cantilever can be used as a heat sink. Further, it is also avoided that an interfering heat radiation emanates from the cantilever if heated too strongly.

In another embodiment of the invention, both the sensor, which transforms the received signal into an evaluable electrical signal, and the sensor evaluation device are arranged outside the coating installation. In this way, a temperature input to both is prevented.

In another embodiment of the invention, the optical position measurement system has a heating element, which is connected with an outside the coating installation arranged heating device via a heating element supply line.

In another embodiment of the invention, the optical position measurement system has a heating element which is conductively connected with an outside the coating installation arranged voltage source via a heating element supply line.

In another embodiment of the invention, the radiation inlet and/or outlet is realized as an inlet or outlet of an optical fiber, and further comprises means for a compensation of the thermal expansion of optical fibers and the cantilever, which are arranged inside the cantilever. This is particularly of advantage if the cantilever expands as a consequence of the heating.

Thus, currents within the range of the optical fiber are avoided during the heating, which can happen through a possible expansion of material of the cantilever.

In another embodiment of the invention, the optical position measurement system has a cantilever, which consists of nickel-plated copper or other coatings that can resist if required the aggressive gas atmosphere of the process.

In another embodiment of the invention, the substrate, whose position is determined within the coating installation using the optical position measurement system according to the invention, is a glass substrate.

In another embodiment of the invention, a coating installation for coating substrates in a continuous method is intended, which comprises according to the invention an optical position measurement system to optically determine the position of the substrate. The optical position measurement system according to the invention is realized in respect to one of the above described embodiments.

BRIEF DESCRIPTION OF THE DRAWINGS

In the following, the invention shall be explained in detail using several examples. The respective figures show, in FIG. 1, a schematic representation of an optical position measurement system according to the invention as a first example, in FIG. 2, a schematic representation of an optical position measurement system according to the invention as a first example for the determination of the position of the substrate in a continuous coating installation in form of a transmitted-light device, and in FIG. 3, a schematic cross-sectional view of an optical position measurement system according to the invention as a second example.

DETAILED DESCRIPTION OF THE INVENTION

Figure 1:
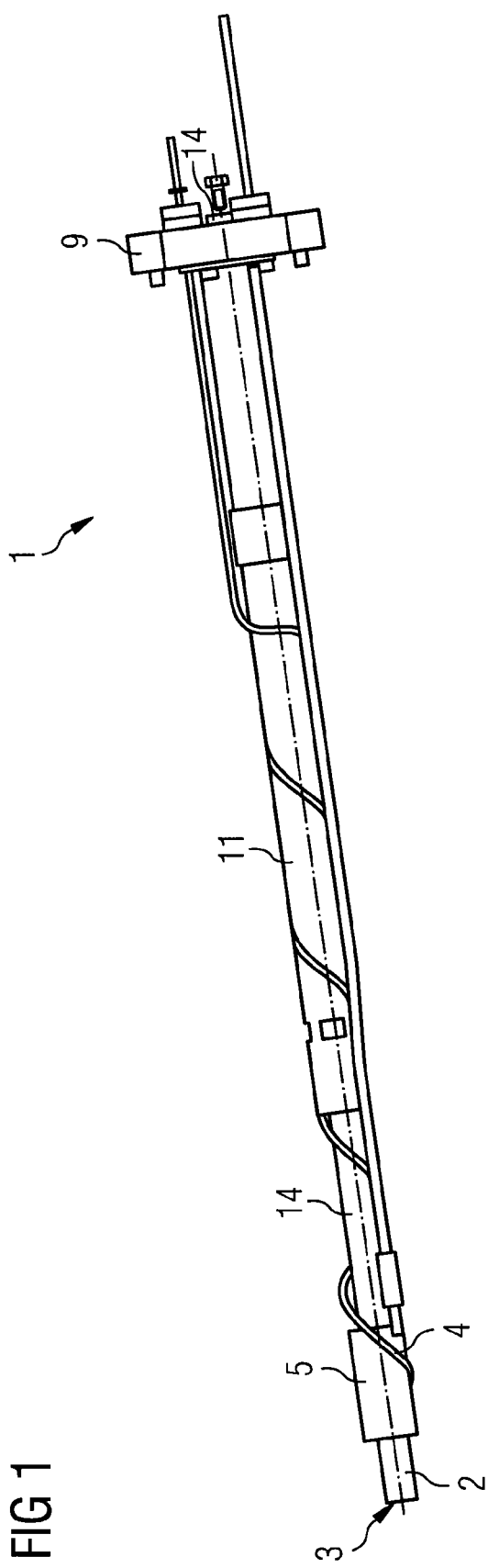

In a first embodiment, the optical position measurement system 1 is presented in FIG. 1. This consists of a cantilever 11, which is made of a metal and in which a light transmitting element 14 is arranged. The light transmitting element 14 is realized as a silica-based glass stick. At the front end of the silica-based glass stick 14 towards the substrate 7, there is a sensor head 2, which has a radiation inlet and/or outlet 3 for the reception and emission of an optical signal. The optical signal is received by a sensor not presented any further, and evaluated by a sensor evaluation device such as a data processing device. The flange 9 forms the transition between the vacuum in the coating installation and the atmosphere. At the same time, the flange 9 serves as a holder for the cantilever 11.

Figure 2:
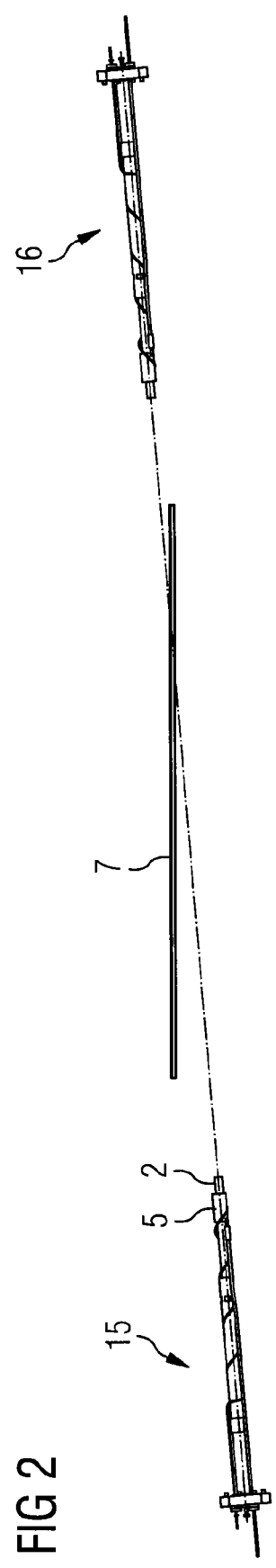

In FIG. 2, a first optical position measurement system 15 and a second optical position measurement system 16 are presented, which determine the position of the substrate 7 in a continuous coating installation. For this purpose, an optical signal is emitted from the first optical position measurement system 15, which is detected by the second optical position measurement system 16. In this connection, a transmitted-light measurement takes place, i.e. the by the second optical position measurement system 16 received signal is consistent with a permanent reception of an optical signal by the first optical position measurement system 15. In the case of a substrate 7, which in a continuous coating installation moves passed the position of the measurement systems, a disruption of the permanent signal from the first to the second optical position measurement system 15, 16 occurs, whereby the position of the substrate 7 can be determined. The duration of the disruption of the optical signal from the first to the second position measurement system 15, 16 thereby reveals the retention time of the substrate 7 within the area of the measurement system.

In another development of this example, an optical position measurement system 1 for determining the position of the substrate 7 in a continuous coating installation is used. The optical position measurement system thereby is placed in relation to the substrate 7 in a way that the determination of the position of the substrate 7 takes place through the reflection of the optical signal, which is emitted from the optical position measurement system 1. The emitted optical signal is reflected by the substrate 7, and detected in the position measurement system 1. In the event that there is no substrate 7 within the area of the optical position measurement system 1, no reflection of the optical signal takes place, and thus, no detection of the reflection.

Figure 3:
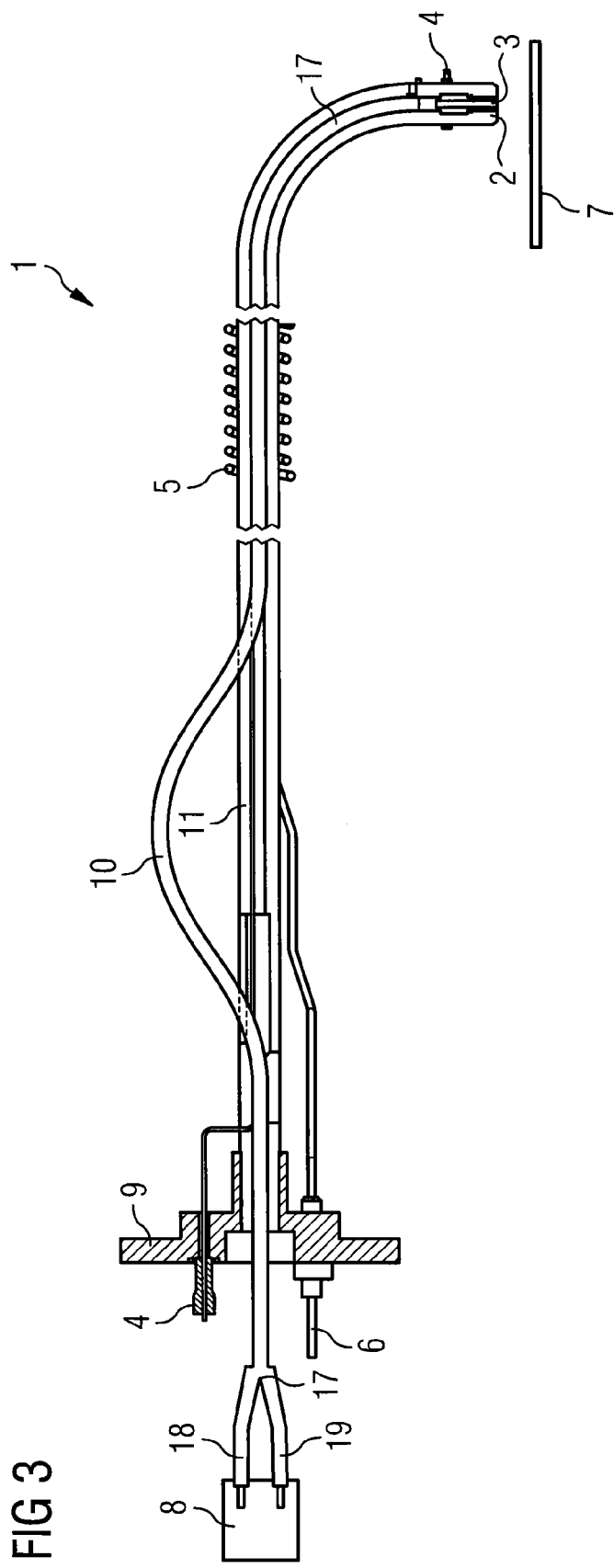

In another embodiment of the invention, an optical position measurement system 1 according to the invention is presented as an example in FIG. 3. The optical position measurement system 1 consists of a cantilever 11, which is a statically fixed element and which is made of nickel-plated copper. Inside, the cantilever 11 receives the optical fiber 17. The cantilever 11 has at its front end a sensor head 2 facing the substrate 7. At the sensor head 2, a radiation inlet and/or outlet 3 for receiving and/or emitting an optical signal is provided. Furthermore, a thermal sensor 4, which is realized as a thermal element, is arranged at the sensor head 2. The sensor head 2 itself is arranged above the substrate 7, but can alternatively be arranged underneath the substrate 7 to determine the position of the substrate 7 using optical position measurement. The evaluation of the through the optical position measurement system 1 determined position of the substrate 7 takes place using an outside the coating installation arranged sensor evaluation device 8, which is realized as a data processing system. The radiation inlet 18 and the radiation outlet 19 are arranged at the sensor evaluation device 8, wherein the radiation outlet serves the emission of an optical signal, whereas the radiation inlet 18 is used for the reception of an optical signal. The received optical signal is processed in the sensor evaluation device 8. Furthermore, a heating element 5 is arranged at the cantilever 11, which is realized as a heating coil. The heating element heats the cantilever 11 which through its thermal conductivity heats the sensor head 2. The heating element 5 is controlled dependent on the by the temperature sensor 4 determined temperature in the coating installation.

In one embodiment during the coating of the substrate with coating material, e.g. selenium, the temperature of the sensor head 2 is kept in a thermal equilibrium slightly above the point of condensation of the coating material. For this purpose, the ambient temperature within the coating installation is determined using the as a thermal element realized temperature sensor 4, and compared with the set value in form of the beforehand defined temperature, for instance the condensation temperature of the coating material. If the through the thermal element 4 determined actual value and the defined set temperature differ, a heating takes place using the heating element 5.

In another embodiment, the temperature at the sensor head 2 is determined using the thermal element 4, and compared with the set value in form of the beforehand defined temperature, for instance the condensation temperature of the semiconductor. If the through the thermal element 4 determined actual value and the defined set temperature differ, the heating takes place using the heating element 5.

In another embodiment, the heating of the heating element 5 takes place at the cantilever 11, which ensures through its thermal conductivity a heating of the sensor head 2.

In another embodiment, the heating of the heating element 5 takes place at the sensor head 2.

In another embodiment, several thermic processes are intended inside the coating installation. If thereby the process ambient temperature in the coating installation is slightly above the point of condensation of the coating material, neither cooling nor heating is required when the cantilever 11 dissipates no or only a little heat, and if the process ambient temperature is below the point of condensation of the coating material, a controlled reheating is necessary using the heating coil 5. The regulation unit which is not presented further in detail determines whether heating is required or not. The heating element 5 then is via a supply line of a heating element 6 connected with a control unit not presented any further in detail which is arranged outside the coating installation. In case of an inductive heating, the heating supply line 6 is realized as a connector of the heating element 5 to a voltage source 12.

In another embodiment, the process ambient temperature is clearly above the point of condensation of the coating material, and even impend to damage the optical fiber 17. Then, the heat is induced in the cooling device 13 via the cantilever 11 which has a good thermal conductivity. The cooling device 13 can be formed by the container wall and the coolant, wherein the cooling device 13 is arranged outside the coating installation. The flange 9 forms thereby the transition from atmosphere to vacuum, and serves as a mechanical holder at the same time. The main function of the cantilever 11 however is the thermal connection to the cool container wall in the event of a necessary cooling of the sensor head 2, or to the heating coil in event of an indirect heating of the sensor head 2.

In another embodiment, the optical position measurement system 1 has a heating and/or cooling element 5 at the the sensor head 2, wherefore the tempering takes place exclusively at the sensor head. For holding the sensor head 2, the cantilever 11 consists of a material of an at least small thermal conductivity such as glass. In this way, the tempering takes place only at the sensor head 2, whereby a greater heat input into the coating installation through heating of the cantilever 11 is avoided.

In another embodiment, a means for compensation of the thermal expansion of optical fibers and cantilever 10 is provided which allows an expansion of the cantilever 11 at higher temperatures.

In another embodiment, the optical position measurement system 1 is used under atmospheric conditions.

The invention claimed is:

1. Optical position measurement system for determination of position of substrates in a coating installation, comprising:
    a cantilever,
    a sensor head, arranged at a free end of the cantilever, the sensor head having at least one of a radiation inlet for reception of an optical signal and a radiation outlet for emission of an signal, and
    means for at least one of heating and cooling of the sensor head depending on at least one of a sensed temperature at the sensor head and a determined ambient temperature within the coating installation, to prevent deposition of coating material at the sensor head.

2. Optical position measurement system according to claim 1, wherein the sensor head is directly heated using a heater arranged at the sensor head.

3. Optical position measurement system according to claim 1, wherein the sensor head is heated indirectly using a heater arranged at the cantilever and thermally conductively connected with the sensor head.

4. Optical position measurement system according to claim 1, wherein the optical position measurement system further comprises a temperature sensor, and the temperature sensor is connected with the means for at least one of heating and cooling via a control circuit.

5. Optical position measurement system according to claim 4, wherein the temperature sensor is arranged at the sensor head.

6. Optical position measurement system according to claim 4, wherein the control circuit compares a reading from the temperature sensor to a condensation temperature of the coating material.

7. Optical position measurement system according to claim 1, wherein the at least one of a radiation inlet and a radiation outlet comprises at least one of an inlet and an outlet of a light transmitting element for linear transmission of the light.

8. Optical position measurement system according to claim 1, wherein the at least one a radiation inlet and a radiation outlet comprises at least one of an inlet and an outlet of an optical fiber, and the optical measurement system further comprises means for compensation of thermal expansion of the optical fibers and the cantilever, said means for compensation being arranged inside the cantilever.

9. Coating installation for coating substrates in a continuous method comprising:
    a transport system to transport substrates through the coating installation,
    an optical position measurement system for optical determination of position of a substrate in the coating installation,
    wherein the optical position measurement system comprises a cantilever to hold the optical position measurement system in the coating installation, and
    a sensor head is arranged at a free end of the cantilever, the sensor head having at least one of a radiation inlet for reception of an optical signal and a radiation for emission of an optical signal, and
    means for at least one of heating and cooling the sensor head depending on at least one of a sensed temperature at the sensor head and a determined ambient temperature within the coating installation, to prevent deposition of coating material at the sensor head.

10. Coating installation according to claim 9, wherein the sensor head is heated by a heater arranged at the sensor head.

11. Coating installation according to claim 9, wherein the sensor head is heated indirectly using a heater arranged at the cantilever and thermally conductively connected with the sensor head.

12. Coating installation according to claim 9, wherein the optical position measurement system further comprises a temperature sensor, and the temperature sensor is connected with the means for at least one of heating and cooling via a control circuit.

13. Coating installation according to claim 12, wherein the temperature sensor is arranged at the sensor head.

14. Coating installation according to claim 12, wherein the control circuit compares a reading from the temperature sensor to a condensation temperature of the coating material.

15. Coating installation according to claim 9, wherein the at least one of a radiation inlet and a radiation outlet comprises at least one of an inlet and an outlet of a light transmitting element for linear transmission of light.

16. Coating installation according to claim 9, wherein the at least one of a radiation inlet and a radiation outlet comprises at least one of an inlet and an outlet of an optical fiber, and the optical measurement system further comprises means for compensation of thermal expansion of optical fiber and the cantilever, the means for compensating being arranged inside the cantilever.

\* \* \* \* \*

UNITED STATES PATENT AND TRADEMARK OFFICE
CERTIFICATE OF CORRECTION

PATENT NO.         : 8,605,292 B2  
APPLICATION NO.    : 13/072909  
DATED              : December 10, 2013  
INVENTOR(S)        : Muchamedjarow et al.

Page 1 of 1

It is certified that error appears in the above-identified patent and that said Letters Patent is hereby corrected as shown below:

In the Claims

Column 10, Line 41, Claim 9, Delete "radiation for" and insert -- radiation outlet for --

Signed and Sealed this
Twenty-fifth Day of February, 2014

Michelle K. Lee
*Deputy Director of the United States Patent and Trademark Office*